(12) United States Patent
Midya et al.

(10) Patent No.: US 7,825,726 B2
(45) Date of Patent: Nov. 2, 2010

(54) DIGITAL PULSE WIDTH MODULATION FOR HALF BRIDGE AMPLIFIERS

(75) Inventors: Pallab Midya, Palatine, IL (US); Matthew R Miller, Arlington Heights, IL (US); William J Roeckner, Carpentersville, IL (US)

(73) Assignee: Freescale Semiconductor, Inc., Austin, TX (US)

( * ) Notice: Subject to any disclaimer, the term of this patent is extended or adjusted under 35 U.S.C. 154(b) by 58 days.

(21) Appl. No.: 12/262,127

(22) Filed: Oct. 30, 2008

(65) Prior Publication Data
US 2010/0109767 A1    May 6, 2010

(51) Int. Cl.
*H03F 3/38*    (2006.01)
(52) U.S. Cl. .................................................. 330/10
(58) Field of Classification Search ................. 330/10, 330/207 A, 251; 375/238–239
See application file for complete search history.

(56) References Cited

U.S. PATENT DOCUMENTS

| | | | |
|---|---|---|---|
| 6,819,912 B2 | 11/2004 | Roeckner et al. | |
| 7,130,346 B2 | 10/2006 | Midya et al. | |
| 7,355,472 B2* | 4/2008 | Kranz | 330/10 |
| 7,579,910 B2* | 8/2009 | Zhang et al. | 330/251 |
| 2008/0252392 A1 | 10/2008 | Midya et al. | |

* cited by examiner

*Primary Examiner*—Robert Pascal
*Assistant Examiner*—Khiem D Nguyen
(74) *Attorney, Agent, or Firm*—Patents and Licensing LLC; Daniel W. Juffernbruch

(57) ABSTRACT

A switching amplifier drives a load or audio transducer. A digital integral noise shaping circuit converts a digital input such as audio content to an output digital pulse width modulated signal using an integrator. The integrator integrates the digital input, a variable frequency reference pulse width modulated signal and an inverse of the output digital pulse width modulated signal. A half bridge amplifier receives the output digital pulse width modulated signal and drives the load or audio transducer. A variable frequency generator generates the variable frequency reference pulse width modulated signal with an approximately equal duty ratio or alternatively varies the variable frequency pulse width modulated signal above and below about a fifty percent duty ratio.

20 Claims, 4 Drawing Sheets

DIGITAL PULSE WIDTH MODULATION FOR HALF BRIDGE AMPLIFIERS

BACKGROUND OF THE INVENTIONS

1. Technical Field

The present inventions relate to switching amplifiers and, more particularly, relate to switching amplifiers employing pulse width modulation and electromagnetic interference reduction.

2. Description of the Related Art

Switching amplifiers have been used to power an audio speaker or transducer. One application for a switching amplifier has been the audio amplifier in an automobile sound system.

Switching amplifiers can cause electromagnetic interference (EMI). Several approaches have been employed to reduce EMI emitted from switching amplifiers. Among others, these have included, first, analog pulse width modulation (PWM) with a dithered switching frequency and, second, spread spectrum digital PWM.

Both analog and digital pulse width modulation (PWM) with a dithered switching frequency has been used to reduce EMI in switching amplifiers. Digital PWM with dithered switching frequency has better performance and greater suitability for high performance switching audio amplifiers at a mass market cost.

Spread spectrum digital pulse width modulation (PWM) has been used to reduce EMI in switching amplifiers. Spread spectrum digital PWM relies on the cancellation of the PWM carrier frequency in the digital integral noise shaping (INS) loop of a full bridge power stage of a switching amplifier.

U.S. Pat. No. 7,130,346 entitled "Method and apparatus having a digital PWM signal generator with integral noise shaping" and issued Oct. 31, 2006 to Midya et al. has a common inventor with the present inventions. This patent describes a spread spectrum digital PWM method that works in a full bridge power stage switching amplifier. A pair of PWM signals is fed back from respective sides of a full bridge power stage. An integral noise shaper needed this pair of PWM signals to operate.

U.S. Patent Publication No. 20080252392 entitled "Discrete Dithered Frequency Pulse Width Modulation" was published on Oct. 16, 2008 by Midya et al. and has a common inventor with the present inventions. It is copending with the present application. It discloses a switching amplifier using spread spectrum digital PWM in a full bridge power stage.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

The details of the preferred embodiments will be more readily understood from the following detailed description when read in conjunction with the accompanying drawings wherein.

DETAILED DESCRIPTION OF THE PREFERRED EMBODIMENTS

Embodiments of the present inventions seek to reduce cost of switching amplifiers. They propose eliminating about half of the components of a full bridge amplifier stage by instead using a half bridge amplifier stage. This can eliminate one output L-C low pass filter. It can require two switches instead of four and require one inductor instead of two in some embodiments.

One way to try applying spread spectrum digital PWM to a half bridge power stage would be eliminating one of the feedback differential inputs to the integrator. This approach does not work in a half bridge power stage because in the previous full bridge solutions differential PWM output signals from both the integrators and duty ratio quantizer were fed back to an input of the integrator—such as taking the spread spectrum digital PWM of the above Midya et al. U.S. Pat. No. 7,130,346 where there is a full bridge power stage available to create the first and second PWM signals. These differential PWM output signals were subtracted by the integrator. Upon their subtraction, the PWM switching frequency was cancelled. In a half bridge amplifier there would be no differential feedback signal and the PWM switching frequency signal could not be eliminated from the operation of the integrator. The PWM switching frequency signal would blow up in the integrator and cause instability or poor performance.

Another way to try applying spread spectrum digital PWM to a half bridge power stage would be to create a digital PWM signal by converting the PCM audio input to a PWM audio signal prior to an integrator and a quantizer. This natural sampling approach to convert the PCM audio input to a PWM audio signal is understood in the art. This worked for a fixed switching frequency but did not work for a variable switching frequency with good audio performance. A variable switching frequency is desired to reduce EMI and achieve good audio performance.

The inventors of the present inventions in some embodiments were able to apply their spread spectrum digital pulse width modulation to a half bridge power stage and still eliminate the PWM switching signal from the integration despite the absence of differential feedback PWM signals available previously in a full bridge power stage. Integral noise shaping (INS) is accomplished by both an integrator and a quantizer together with a feedback loop such as the PWMA loop and a variable frequency reference pulse width modulated signal such as a generated PWMB signal.

Figure 1:
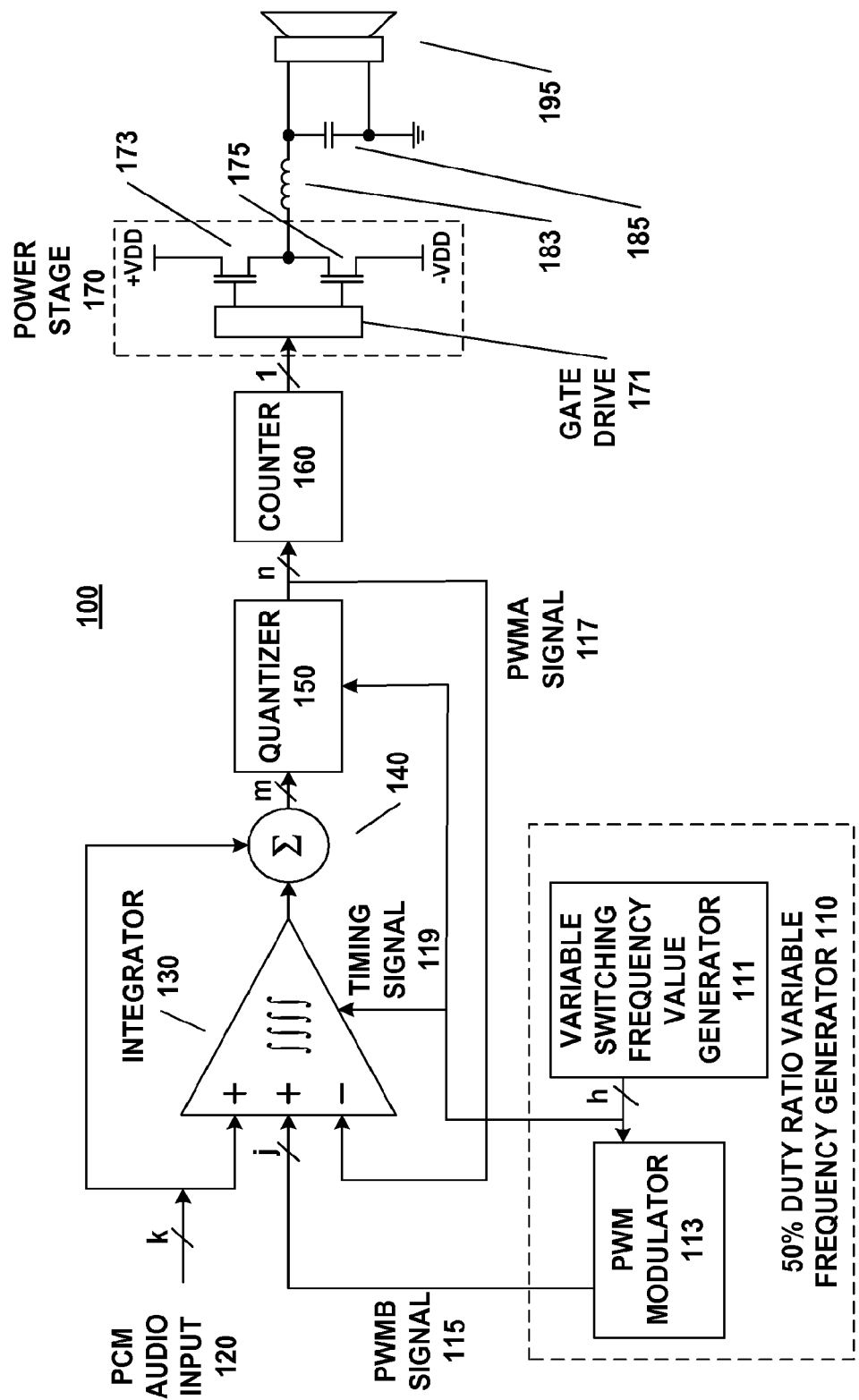
FIG. 1 illustrates a schematic diagram of a switching amplifier with a half bridge using a variable frequency generator according to one embodiment of the present inventions.

FIG. 1 illustrates a schematic diagram of a switching amplifier with a half bridge using a variable frequency generator according to the present inventions. A 50% duty ratio variable frequency generator 110 is employed to create a PWMB signal 115 to be integrated with the one feedback PWMA signal 117. The PWMB signal 115 in one embodiment can be called a variable frequency reference pulse width modulated signal. In combination with other circuit elements, this new PWMB signal 115 generated from the 50% duty ratio variable frequency generator 110 in certain embodiments provides a variable frequency reference pulse width modulated signal with these functions: The PWMB signal 115 not only simulates a paired input for the one feedback PWMA signal 117 but also provides for a switching frequency value to reduce EMI in the switching amplifier using a spread spectrum digital PWM technique. Thus the PWMB signal 115 is used for the purpose of the digital integral noise shaping (INS) but is not generated in the power stage. The PWMB signal 115 is also used to provide suppression of the carrier of the spread spectrum digital PWM. The differential PWM signal is made equal to the PCM audio input 120 by the action of a digital integral noise shaping (INS) feedback loop.

The PWMB signal 115 should have a higher resolution than the PWMA signal 117 in one embodiment. PWMA signal 117 has a resolution capable of being counted by the counter 160. Because the counter is typically implemented in hardware and has practical limitations to its resolution and speed, the PWMA signal 117 is limited to a lower word width n of resolution. Because the PWMB signal 115 is typically implemented in a digital signal processor it can have a higher word width j of resolution. Because the PWMA signal 117 is fed back and the PWMB signal 115 is not fed back, the PWMA signal can have its errors corrected by the loop while errors in the PWMB signal 115 are not corrected because of its feed forward arrangement. Thus the PWMB signal 115 is preferably of a higher resolution. A higher resolution for the PWMB signal 115 is more easily achievable when not implemented with a counter in some embodiments. The word width n of PWMA signal 117 is smaller than the word width j of PWMB signal 115.

Since only the first PWMA signal 117 is generated by the power stage the second PWMB signal 115 is driven to zero in the audio band. As a result the first PWMA signal 117 is equivalent to the PCM audio input 120 which is the desired goal in some embodiments. To achieve good signal to noise ratio (SNR) and good dynamic range over the entire audio band the first PWMA signal 117 is preferably equivalent to the digital PCM input in the audio band. Ideally the PWMB signal 115 should have no audio content. With a duty ratio constant at 50% this can be achieved.

The fixed duty ratio of PWMB signal 115 can be fixed to a value other than 50%. This is useful to correct for DC offset. If the supply rails in the power stage 170 are unequal, for example, then the nominal value can be other than 50% (which is half) to achieve DC offset correction.

While the embodiment of FIG. 1 shows an exemplary constant duty ratio, variable frequency signal PWMB 115, a varying duty ratio signal PWMB 115 will be described with respect to the alternate frequency generator in the alternate embodiment of FIG. 2. A varying duty ratio signal PWMB 115 improves audible quality in audio applications.

The input 120 is in a digitally modulated form such as pulse code modulation (PCM) or pulse density modulation (PDM). PCM and PDM are known audio formats. In the example application, the input is preferably of audio band content. A PCM audio input 120 in this embodiment is amplified by the switching amplifier 100 and ultimately reproduced by a speaker or transducer 195. An integrator 130 is controlled by a timing signal 119 from a variable switching frequency value generator 111 of the 50% duty ratio variable frequency generator 110. The integrator 130 integrates the PCM audio input 120, the PWMB signal 115 and an inverse of the feedback PWMA signal 117.

A summer 140 sums the output of the integrator 130 and the PCM audio input signal 120 before being quantized in a multi-bit quantizer 150. The quantizer 150 operates under control of the timing signal 119 from the variable switching frequency value generator 111 of the 50% duty ratio variable frequency generator 110 and utilizes a quantization clock for quantizing. A counter 160 counts the output of the quantizer 150 to produce a binary output pulse width modulated waveform to drive the power stage 170.

The integrator 130, the summer 140 and the quantizer 150 are implementable by a processor or by discrete circuits which operate on digital signals of particular digital word widths. An exemplary signal word width of k is illustrated for the PWM audio input signal. Likewise word width j for the PWMB signal 115, word width m for the output of the summer 140 and word width n for the output of the quantizer 150 are illustrated in FIG. 1. The counter 160 counts the output of the quantizer 150 to produce the output pulse width modulated waveform—a serial binary output of an exemplary word width of one.

The power stage 170 contains a gate drive 171 and opposing field effect transistors FET 173 and FET 175 respectively coupled to respective supply rails such as +VDD and −VDD. A low pass filter removes higher frequency harmonics from the switching amplifier. This low pass filter is constructed by the illustrated exemplary embodiment of FIG. 1 by the inductor 183 and the capacitor 185. Besides FETs, the power stage 170 could be constructed in other ways such as of bipolar transistors and/or in an integrated circuit.

The switching amplifier 100 couples to a transducer or speaker 195 to reproduce audio sound. In an alternate application different transducers besides speakers could be used for coupling to the output of the switching amplifier 100.

The 50% duty ratio variable frequency generator 110 illustrated in FIG. 1 preferably contains the illustrated variable switching frequency value generator 111 and PWM modulator 113. The variable switching frequency value generator 111 outputs a value indicative of a desired PWM frequency. The output of the variable switching frequency value generator 111 is preferably a digital signal of word width h. The value of this output controls the switching frequency of the switching amplifier 100. This output also provides the timing signal 119 for both the integrator 130 and the quantizer 150.

The PWM modulator 113 in the embodiment of FIG. 1 is a modulator for creating a 50% duty ratio pulse width modulated signal of a varying frequency dependent on the value from the variable switching frequency value generator 111. When the output value of the variable switching frequency value generator 111 varies, the switching frequency of the switching amplifier varies with it and a spread spectrum digital approach is achieved. One exemplary embodiment for also varying the duty ratio of the PWMB signal 115 will be disclosed with respect to the alternate embodiment of FIG. 2.

Figure 2:
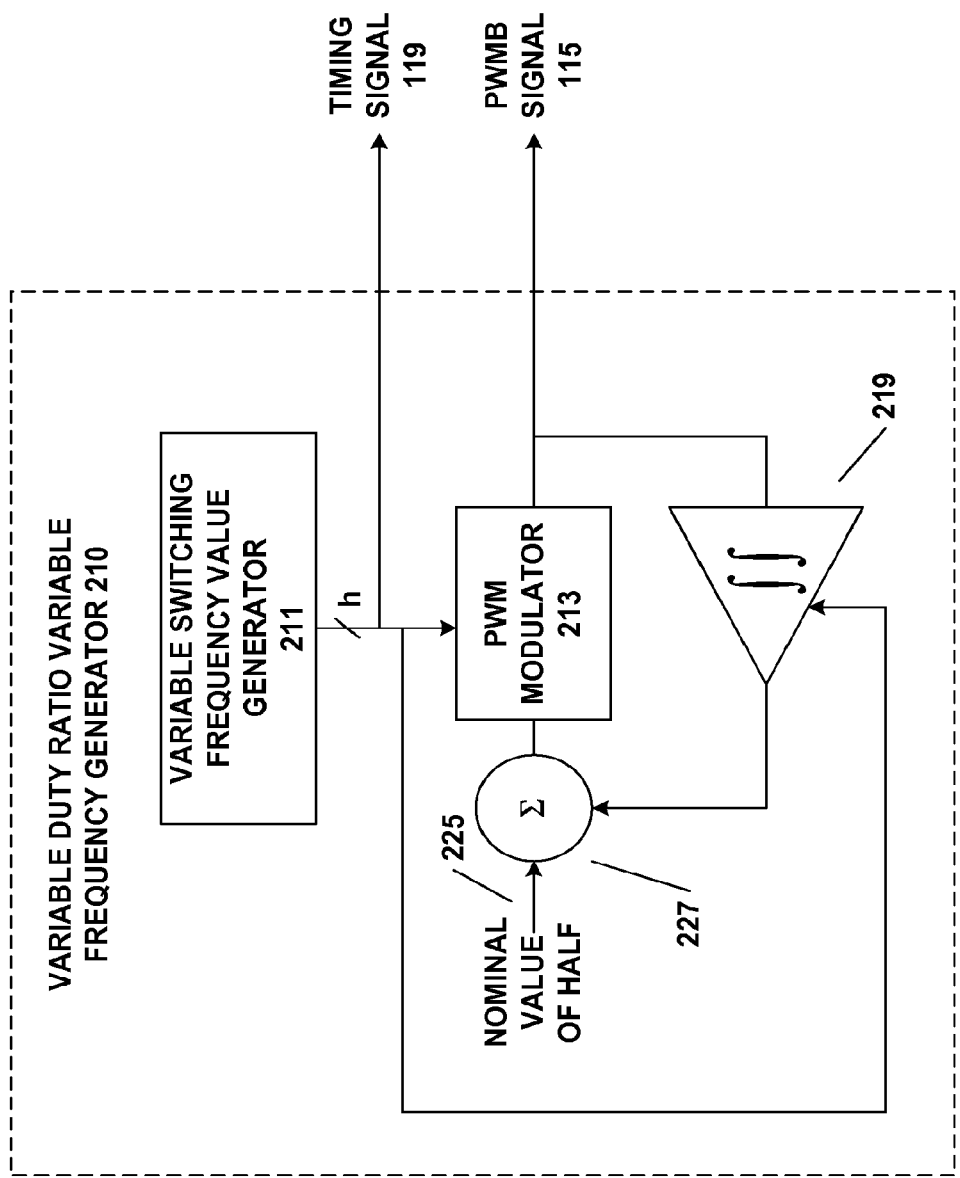
FIG. 2 illustrates an alternative variable frequency generator with a varying duty ratio according to one embodiment of the present inventions.

FIG. 2 illustrates an alternative variable frequency generator 210 with a varying duty ratio according to the present inventions. A varying duty ratio is provided by this alternate frequency generator of FIG. 2. The illustrated circuit varies both the switching frequency and the duty ratio of digital pulse width modulated signal PWMB 115. An alternative variable duty ratio variable frequency generator 210 is illustrated. This variable duty ratio variable frequency generator 210 can be substituted for the 50% duty ratio variable frequency generator 110 of the embodiment of FIG. 1.

The PWMB signal 115 ideally has no noise in the audio band. In this alternative embodiment the PWMB signal 115 has a nominally 50% (or half) duty ratio. The duty ratio can be adjusted about this nominal value to further reduce noise in the audio band as illustrated in FIG. 2. This duty ratio is noise shaped to reduce the spectral content of the PWMB signal 115 within a desired frequency band. FIG. 2 shows an integrating amplifier 219. The integrating amplifier 219 receives PWMB signal 115 and suppresses switching frequencies and amplifies audio signals. Both a desired nominal value 225 and the output of integrating amplifier 219 is input to a summer 227. The nominal value 225 determines the nominal value of the duty ratio about which the PWMB signal 115 is varied above and below in this embodiment. The summer output is input to a PWM modulator 213 to produce a PWM signal with an adjusted duty ratio PWMB signal 115 which has a nominal 50% duty ratio and a variable switching frequency. Timing signal 119 from a variable switching frequency value generator 211 provides timing information to PWM modulator 213 and integrating amplifier 219. The PWMB signal 115 in this embodiment has lower audio band noise than a variable switching frequency pulse width modulated signal in the embodiment of FIG. 1 with a fixed 50% duty ratio.

The nominal value 225 is preferably about half (which is about 50%). If the supply rails are unequal, then the nominal value can be other than half to achieve DC offset compensation.

The varying duty ratio of FIG. 2 could also be implemented using a table of duty ratio values which is cycled through in a processor. This achieves the varying duty ratio result without the computational components illustrated in FIG. 2.

The switching amplifiers disclosed herein are well suited to integrated circuits, processors and digital signal processors for Audio Video Receivers (AVR) and home theater systems as well as lower power channels (tweeter channels) of automotive audio amplifiers. Improved EMI mitigation with a lower cost half bridge power stage implementation is achieved. This is useful in many areas including consumer audio products and desirable in automotive products. Integrated circuits, processors and digital signal processors for other applications could also be implemented.

Figure 3:
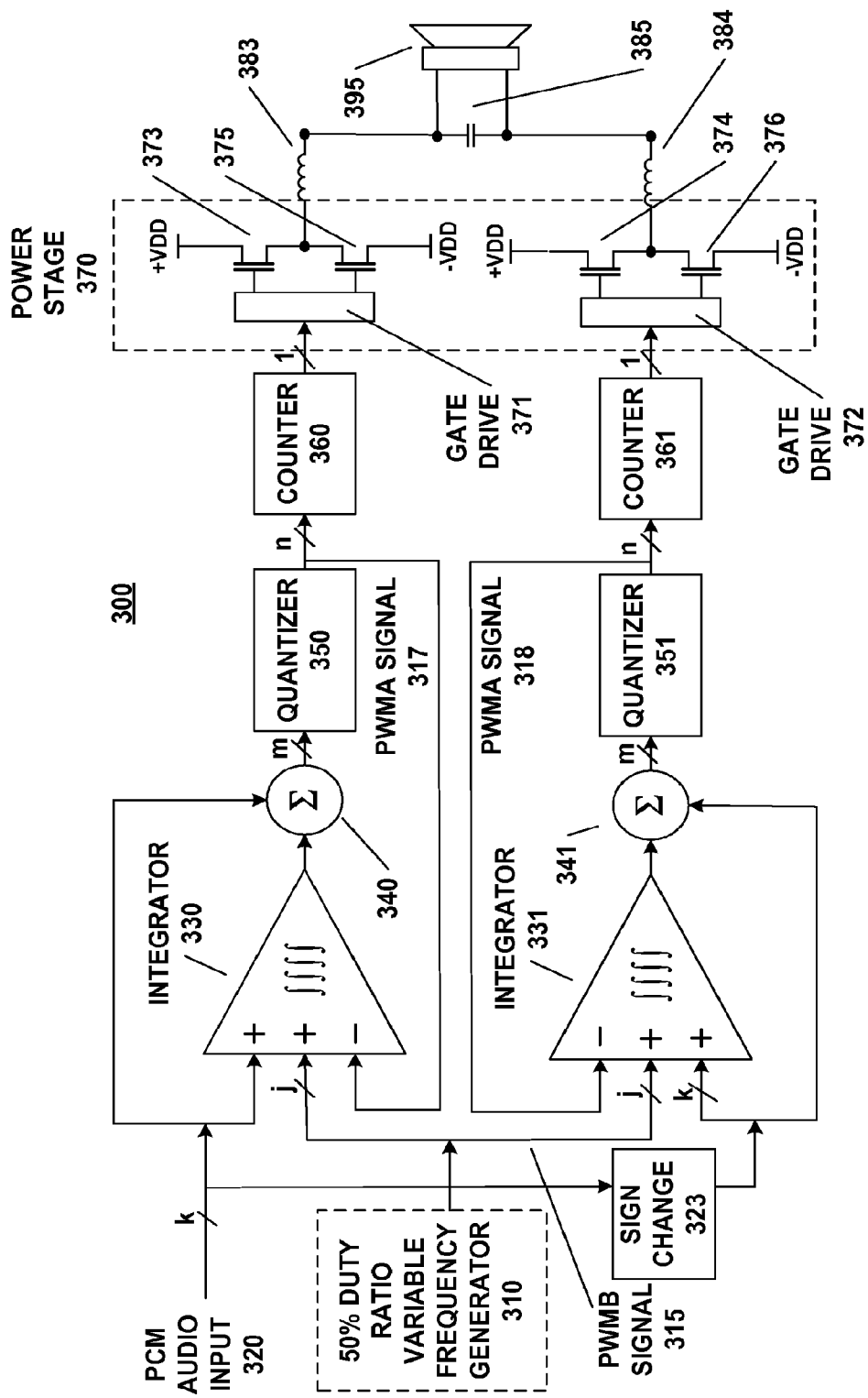
FIG. 3 illustrates a schematic diagram of a switching amplifier with a pair of half bridge amplifiers using the variable frequency generator according to one embodiment of the present inventions.

FIG. 3 illustrates a schematic diagram of another embodiment of a switching amplifier with a pair of half bridge amplifiers using the variable frequency generator according to an embodiment of the present inventions. The PCM audio input 320 is operated upon by a pair of instantaneous noise shaping branches, one for each half bridge power stage. A first instantaneous noise shaping branch is made up of integrator 330, summer 340, quantizer 350, counter 360 and gate drive 371. A second instantaneous noise shaping branch is made up of integrator 331, summer 341, quantizer 351, counter 361 and gate drive 372. A 50% duty ratio variable frequency generator 310 provides a PWMB signal 315 to plus inputs of both the integrator 330 and the integrator 331. The PWMB signal 315 can be called a variable frequency reference pulse width modulated signal.

The 50% duty ratio variable frequency generator 300 is constructed using the above approaches. However, because the PWMB signal 315 is common to both half bridge amplifiers in FIG. 3, any audio content in the PWMB signal 315 will be differentially cancelled, and a varying duty ratio is unneeded in some embodiments. Thus the alternate embodiment in FIG. 2 is unnecessary in the embodiment of FIG. 3.

A sign change operation 323 is performed on the PCM audio input 320 before being input in the second path to the integrator 331 and the summer 341. PWMA signal 317 and PWMA signal 318 from their respective quantizers are fed back in first and second loops to inputs of their respective integrators 330 and 331 as illustrated in FIG. 3.

The power stage 370 contains gate drives 371 and 372 and respective opposing field effect transistors FET 373 and FET 375 and FET 374 and FET 376 respectively coupled to +VDD and −VDD. Low pass filters remove higher frequency harmonics. The low pass filters are constructed for the first path by the inductor 383 and the capacitor 385 or for the second path by the inductor 384 and the capacitor 385. The switching amplifier 300 couples to a transducer or speaker 395 to reproduce audio sound.

As another exemplary alternative embodiment, in some applications the same integrated circuit could be used to generate some channels (such as surround sound or tweeter channels) of the half bridge implementation of FIG. 1 for a lower quality or power audio signal and other channels (such as the main left and right channels) of the pair of half bridge implementation of FIG. 3 for a higher quality or power audio signal. An integrated circuit could be manufactured with an array of half bridge amplifiers and then customized to combine some pairs of half bridge amplifiers such as in FIG. 3.

Figure 4:
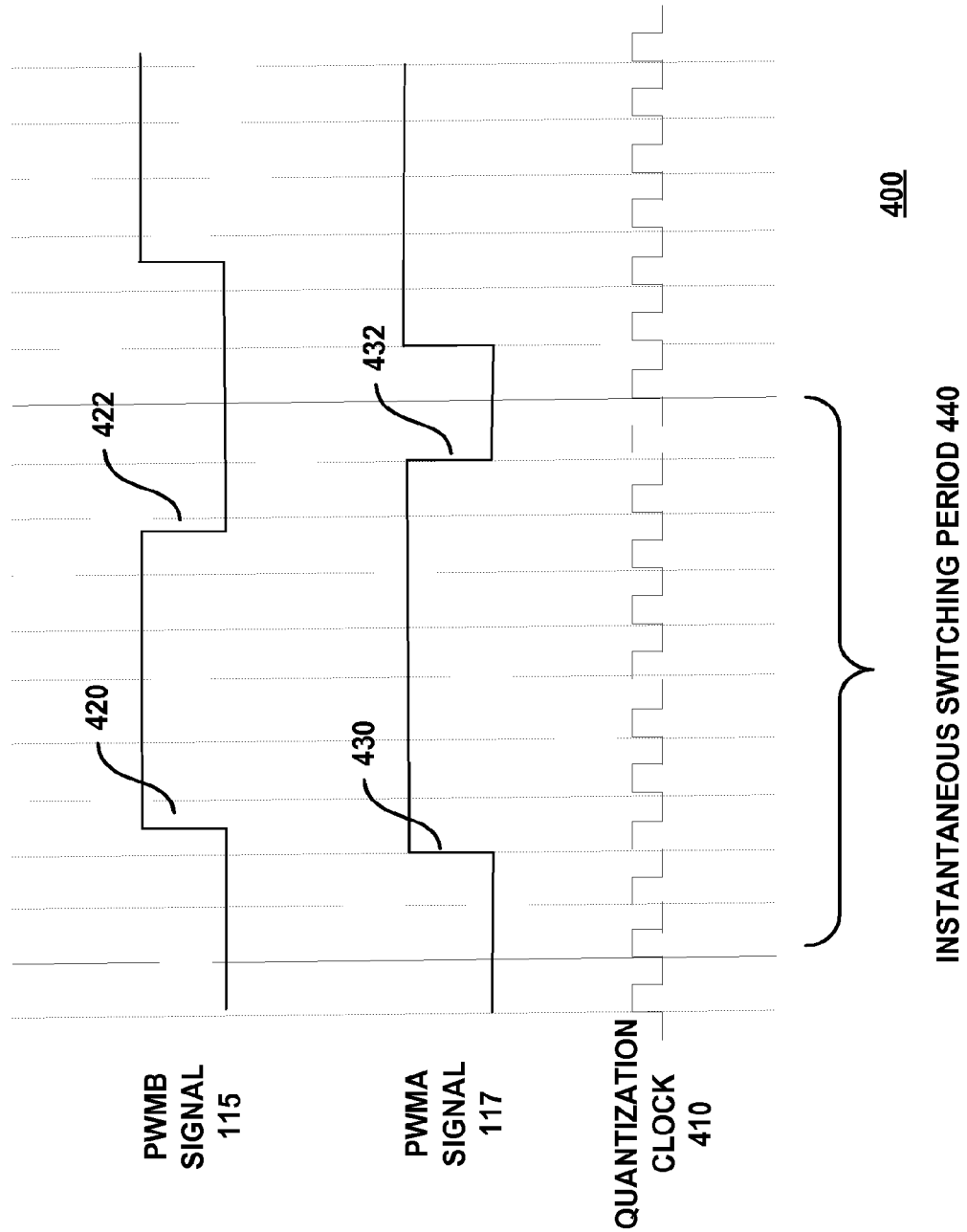
FIG. 4 illustrates a signal timing diagram of a PWMA signal, a PWMB signal and a quantization clock for a quantizer according to one embodiment of the present inventions.

FIG. 4 illustrates a signal timing diagram 400 of the PWMA signal 117, the PWMB signal 115 and a quantization clock 410 for the quantizer according to the present inventions. The quantization clock 410 is the same as a system clock of the quantizer 150 and of the counter 160. The PWMA signal 117 and PWMB signal 115 repeat every instantaneous switching period 440. The quantizer 150 quantizes the PWMA signal 117 at edges 430 and 432 so that the edges are concurrent with the quantization clock 410 of the quantizer. Because edges 420 and 422 of the PWMB signal 115 do not need to be aligned with a clock, the edges 420 and 422 can fall between the edges of the quantization clock 410 as illustrated. This signal timing diagram 400 of FIG. 4 is a further illustration of how the PWMB signal 115 has a higher resolution than the PWMA signal 117.

By varying a PWM switching frequency over a wide range, the switching frequency of the switching amplifier 100 is spread and an efficient spread spectrum digital PWM signal is generated for the half bridge switching amplifier 100. This can provide greater than 100 dB+ dynamic range in the digital domain for audio applications. This is useful in the disclosed Class-D or switching amplifiers.

The illustrated circuits 110, 130, 140 and 150 before the counter 160 are preferably implemented in a digital signal processor. The illustrated power stage circuit 170 and low pass filter 183, 185 after the quantizer 150 is preferably implemented in hardware. The counter 160 is also implemented in hardware in the preferred embodiment. However, the former portions implemented in a digital signal processor can be implemented in hardware as well. And additionally the counter can be implemented in a digital signal processor or counter and power stage implemented in another integrated circuit.

The signal processing techniques disclosed herein with reference to the accompanying drawings are preferably implemented on one or more digital signal processors (DSPs) or other microprocessors. Nevertheless, such techniques could instead be implemented wholly or partially as discrete components. Further, it is appreciated by those of skill in the art that certain well known digital processing techniques are mathematically equivalent to one another and can be represented in different ways depending on choice of implementation.

Although the invention is described herein with reference to specific embodiments, various modifications and changes can be made without departing from the scope of the present invention as set forth in the claims below. For example, the low pass filter may be replaced by an EMI filter. Additionally, while the switching amplifier described herein is optimum for audio applications, it could be used beyond amplifiers and be implemented instead in motor control and power supply applications. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Any letters designations such as (a) or (b) etc. used to label steps of any of the method claims herein are step headers applied for reading convenience and are not to be used in interpreting an order or process sequence of claimed method steps. Any method claims that recite a particular order or process sequence will do so using the words of their text, not the letter designations.

Unless stated otherwise, terms such as "first" and "second" are used to arbitrarily distinguish between the elements such terms describe. Thus, these terms are not necessarily intended to indicate temporal or other prioritization of such elements.

A switching amplifier is capable of driving a load. A variable frequency generator generates a variable frequency reference pulse width modulated signal. A digital circuit converts a digital input to an output digital pulse width modulated signal with a variable switching frequency. An integrator produces the output pulse width modulated signal by integrating the digital input, the variable frequency reference pulse width modulated signal and an inverse of the output digital pulse width modulated signal. A half bridge switching amplifier stage receives the output digital pulse width modulated signal and amplifies the output digital pulse width modulated signal to drive the load.

An additional half bridge amplifier path can be deployed in parallel and use a variable frequency reference pulse width modulated signal to also drive the load or another load.

What is claimed is:

1. A switching amplifier circuit capable of driving a half bridge switching amplifier stage, comprising:
a variable frequency generator for generating a variable frequency reference pulse width modulated signal, wherein the variable frequency generator varies a frequency of the frequency reference pulse width modulated signal to generate a varying frequency reference pulse width modulated signal; and
a digital integral noise shaping circuit for converting a digitally modulated digital input to an output digital pulse width modulated signal with a variable switching frequency, the digital integral noise shaping circuit comprising a digital integrator for producing the output pulse width modulated signal by digitally integrating the digitally modulated digital input, the variable frequency reference pulse width modulated signal and an inverse of the output digital pulse width modulated signal, wherein the output digital pulse width modulated signal is available to drive the half bridge switching amplifier stage.

2. A switching amplifier circuit according to claim 1, wherein the variable frequency generator generates the reference pulse width modulated signal with an approximately equal duty ratio.

3. A switching amplifier circuit according to claim 1, wherein a value for a duty ratio of the varying frequency reference pulse width modulated signal is chosen to a duty ratio sufficient to compensate for DC offsets in the switching amplifier.

4. A switching amplifier circuit according to claim 1, wherein a resolution of the variable frequency pulse width modulated signal generated by the variable frequency generator is greater than a resolution of the output digital pulse width modulated signal.

5. A switching amplifier circuit according to claim 1, wherein the variable frequency generator comprises circuitry to vary both the pulse width and the switching frequency of the variable frequency reference pulse width modulated signal.

6. A switching amplifier circuit according to claim 5, wherein the circuitry to vary both the pulse width and the switching frequency varies the pulse width of the pulse width modulated signal above and below a nominal duty ratio of about 50%.

7. A switching amplifier circuit according to claim 1, wherein the digitally modulated digital input is in a digitally modulated form chosen from the group consisting of pulse code modulation (PCM) and pulse density modulation (PDM).

8. A switching amplifier circuit according to claim 1, wherein the digitally modulated digital input is a pulse code modulation (PCM) audio input.

9. A switching amplifier circuit according to claim 1, further comprising
a half bridge switching amplifier stage operatively coupled to receive the output digital pulse width modulated signal and amplify the output digital pulse width modulated signal for driving a load.

10. A switching amplifier circuit according to claim 1, wherein the switching amplifier circuit further comprises:
a half bridge amplifier operatively coupled to amplify the output digital pulse width modulated signal;
a secondary digital integral noise shaping circuit comprising a secondary digital integrator for converting an inverse of the digital input to a secondary output digital pulse width modulated signal;
a secondary half bridge amplifier operatively coupled to amplify the secondary output digital pulse width modulated signal; and
wherein the variable frequency generator is operatively coupled to both a summing input of the digital integrator and a summing input of the secondary digital integrator.

11. A switching amplifier circuit according to claim 1, wherein the digital integrator uses a varying switching frequency timing signal to clock its digital integration.

12. A switching amplifier circuit capable of driving a half bridge switching amplifier stage, comprising:
a variable frequency generator for generating a variable frequency reference pulse width modulated signal;
a digital circuit for converting a digital input to an output digital pulse width modulated signal with a variable switching frequency, the digital circuit comprising an integrator for producing the output pulse width modulated signal by integrating the digital input, the variable frequency reference pulse width modulated signal and an inverse of the output digital pulse width modulated signal, wherein the output digital pulse width modulated signal is available to drive the half bridge switching amplifier stage;
a summer operatively coupled to sum an output of the integrator and the digital input; and
a multi-bit quantizer coupled to an output of the summer to produce the output digital pulse width modulated signal.

13. A switching amplifier circuit according to claim 12, wherein the digital circuit for converting the digital input further comprises
a counter coupled to the output pulse width modulated signal for generating an output pulse width modulated waveform signal.

14. A switching amplifier circuit according to claim 12, wherein a resolution of the variable frequency pulse width modulated signal generated by the variable frequency generator is greater than a resolution of the output digital pulse width modulated signal.

15. A switching amplifier circuit according to claim 12, wherein the variable frequency generator comprises circuitry to vary both the pulse width and the switching frequency of the variable frequency reference pulse width modulated signal.

16. A switching amplifier circuit according to claim 15, wherein the circuitry to vary both the pulse width and the switching frequency varies the pulse width of the pulse width modulated signal above and below a nominal duty ratio of about 50%.

17. A method for amplifying a digital input and drive a load via a half bridge, the method comprising the steps of:
(a) generating a variable frequency reference pulse width modulated signal;
(b) converting the digital input to an output digital pulse width modulated signal with a variable switching frequency by integrating the digital input, the variable frequency reference pulse width modulated signal and an inverse of the output digital pulse width modulated signal;
(c) summing an output of the integrator and the digital input;
(d) quantizing an output of the summer to produce the output digital pulse width modulated signal; and
(e) driving the half bridge with the output digital pulse width modulated signal.

18. A method according to claim 17, wherein said step (a) of generating the variable frequency reference pulse width modulated signal generates the variable frequency reference pulse width modulated signal with an approximately equal duty ratio.

19. A method according to claim 17, wherein said step (a) of generating the variable frequency reference pulse width modulated signal varies both the pulse width and the frequency of the variable frequency reference pulse width modulated signal.

20. A method according to claim 19, wherein said step (a) of generating the variable frequency reference pulse width modulated signal by varying the pulse width of the variable frequency reference pulse width modulated signal varies the pulse width of the variable frequency reference pulse width modulated signal above and below a nominal duty ratio of about 50%.

* * * * *